US012046545B2

United States Patent
Kim et al.

(10) Patent No.: US 12,046,545 B2
(45) Date of Patent: Jul. 23, 2024

(54) HYBRID RECONSTITUTED SUBSTRATE FOR ELECTRONIC PACKAGING

(71) Applicant: QUALCOMM Incorporated, San Diego, CA (US)

(72) Inventors: Jonghae Kim, San Diego, CA (US); Milind Shah, San Diego, CA (US); Periannan Chidambaram, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 79 days.

(21) Appl. No.: 17/093,090

(22) Filed: Nov. 9, 2020

(65) Prior Publication Data

US 2022/0148953 A1 May 12, 2022

(51) Int. Cl.
| | |
|---|---|
| *H01L 23/498* | (2006.01) |
| *H01L 21/48* | (2006.01) |
| *H01L 21/56* | (2006.01) |
| *H01L 23/31* | (2006.01) |
| *H01L 25/18* | (2023.01) |
| *H01L 23/48* | (2006.01) |
| *H01L 27/01* | (2006.01) |

(52) U.S. Cl.
CPC ...... *H01L 23/49833* (2013.01); *H01L 21/481* (2013.01); *H01L 21/56* (2013.01); *H01L 23/3107* (2013.01); *H01L 25/18* (2013.01); *H01L 23/481* (2013.01); *H01L 27/01* (2013.01)

(58) Field of Classification Search
None
See application file for complete search history.

(56) References Cited

U.S. PATENT DOCUMENTS

| | | | | |
|---|---|---|---|---|
| 9,559,081 | B1* | 1/2017 | Lai | ........ H01L 23/5389 |
| 2016/0181176 | A1* | 6/2016 | Yu | ........ H01L 23/3107 |
| | | | | 257/712 |
| 2018/0138151 | A1* | 5/2018 | Shih | ........ H01L 25/50 |
| 2021/0151407 | A1* | 5/2021 | Liu | ........ H01L 23/49822 |

FOREIGN PATENT DOCUMENTS

| | | | | | |
|---|---|---|---|---|---|
| CN | 102646668 | * | 8/2012 | ........ | H01L 21/486 |
| CN | 102646668 A | * | 8/2012 | ........ | H01L 21/486 |

* cited by examiner

*Primary Examiner* — Hung K Vu
(74) *Attorney, Agent, or Firm* — Patterson + Sheridan, LLP

(57) ABSTRACT

A reconstituted substrate, a packaged assembly comprising a reconstituted substrate, and methods for fabricating a reconstituted substrate. An example reconstituted substrate generally includes multiple package-level substrates implemented with different substrate technologies and held together. An example method for fabricating a reconstituted substrate generally includes forming multiple package-level substrates implemented with different substrate technologies, arranging the multiple package-level substrates, and adding a material to hold the multiple package-level substrates together.

16 Claims, 5 Drawing Sheets

HYBRID RECONSTITUTED SUBSTRATE FOR ELECTRONIC PACKAGING

BACKGROUND

Field of the Disclosure

Certain aspects of the present disclosure generally relate to electronic components and, more particularly, to a reconstituted substrate comprising multiple package-level substrates implemented with different substrate technologies.

Description of Related Art

Electronic devices, such as computers, wireless communications devices (e.g., smartphones and Wi-Fi access points), and wearable devices, have come into widespread use in recent years. The electronic devices typically include one or more integrated circuits (ICs). These ICs are typically included in one or more dies and other electronic components, which may be included in an IC package for assembly on a printed circuit board (PCB) and included in an electronic device.

Packaging integrated circuit dies and other components together in modules (also referred to herein as "packaged assemblies") may enable electronic devices to have a smaller form factor while providing improved electrical performance (e.g., reduced power consumption) and thermal performance (e.g., reduced heat generation), as compared to previously known electronic devices. For example, a cellular phone may have improved battery life due to a reduction in power consumed by a transceiver module in which dies and other components are assembled in a packaged assembly.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved chipset integration and performance.

Certain aspects of the present disclosure generally relate to a reconstituted substrate, a packaged assembly including a reconstituted substrate, and methods for fabricating a reconstituted substrate.

Certain aspects of the present disclosure are directed to a reconstituted substrate. The reconstituted substrate generally includes multiple package-level substrates implemented with different substrate technologies and held together.

Certain aspects of the present disclosure are directed to a packaged assembly. The packaged assembly generally includes a reconstituted substrate comprising multiple package-level substrates implemented with different substrate technologies and held together; and multiple chipsets for different applications coupled to the multiple package-level substrates of the reconstituted substrate.

Certain aspects of the present disclosure are directed to a method of fabricating a reconstituted substrate. The method generally includes forming multiple package-level substrates implemented with different substrate technologies, arranging the multiple package-level substrates, and adding a material to hold the multiple package-level substrates together.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to a hybrid reconstituted substrate, a packaged assembly including a hybrid reconstituted substrate, and methods for fabricating a hybrid reconstituted substrate. As used herein, a hybrid reconstituted substrate generally refers to a combination of multiple substrates (e.g., package-level substrates) implemented with different substrate technologies and held together (e.g., by a molding material).

Example Packaged Assembly

Figure 1A:
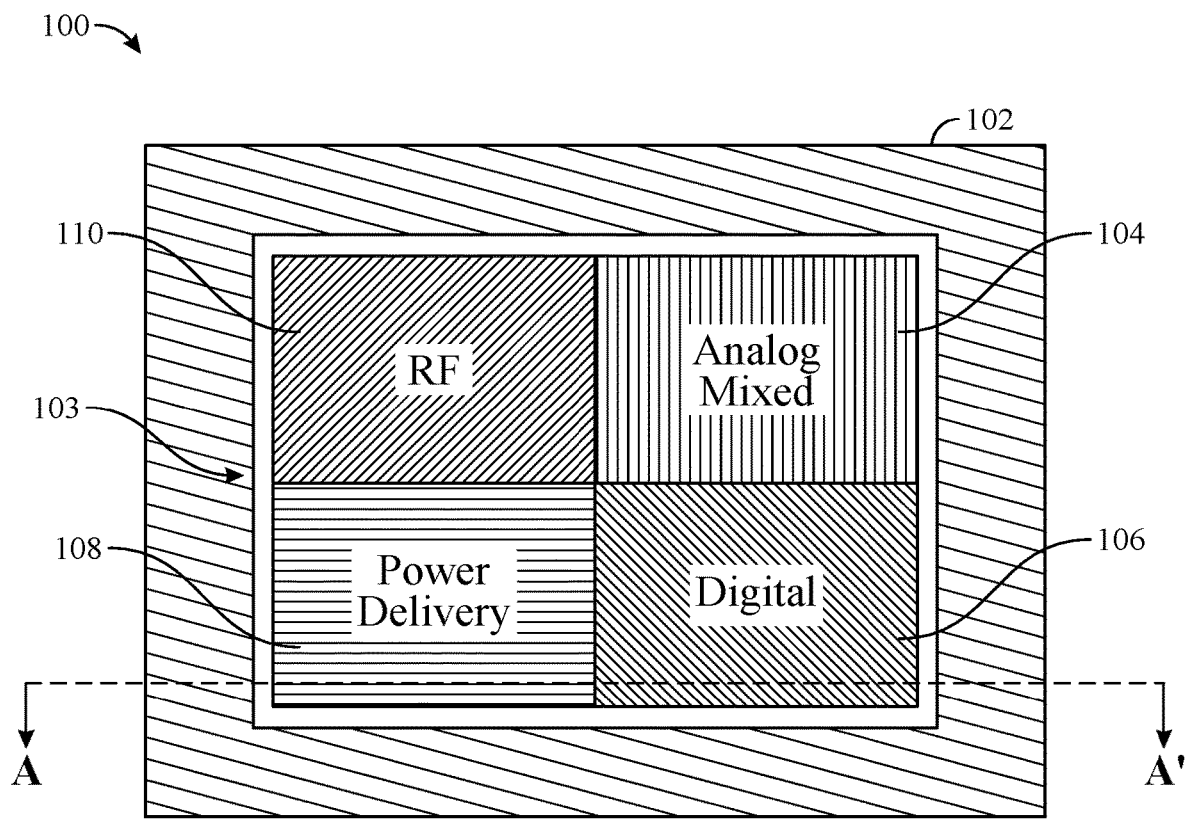
FIGS. 1A and 1B are cross-sectional views of an example packaged assembly for a chipset supporting multiple different technologies.
Figure 1B:
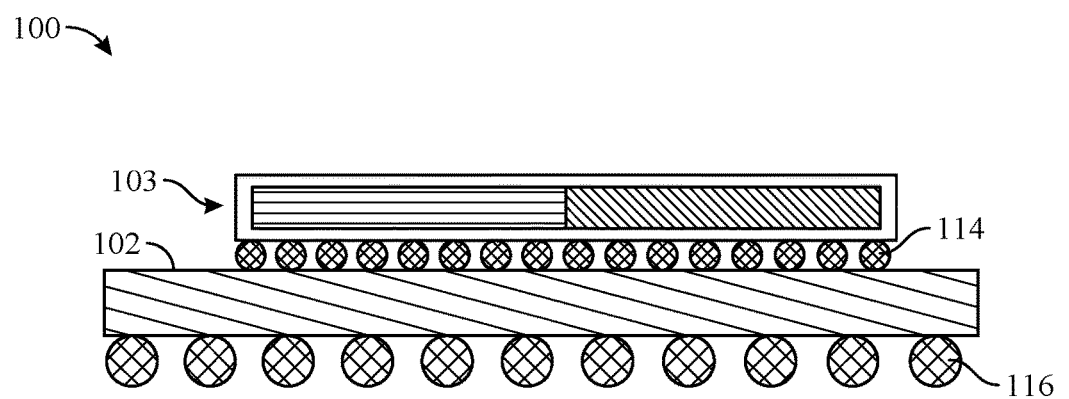

FIG. 1A is a top view of an example packaged assembly 100. As shown, the packaged assembly 100 may include a substrate 102 with chipsets 103 disposed above the substrate 102. The chipsets 103 may include multiple chipsets for different applications, which may be implemented with different technologies. For example, in the field of wireless communications, the chipsets 103 may include an analog or mixed signal (AMS) chipset 104, a digital chipset 106, a power distribution network (PDN) chipset 108 (also referred to as a "power delivery chipset"), and a radio frequency (RF) chipset 110. As shown in FIG. 1B, which is a cross-sectional view along the line A-A' of FIG. 1A, each of the chipsets 103 may be coupled to the substrate 102 by solder bumps 114 or conductive pillars (e.g., copper (Cu) pillars). Furthermore, solder balls 116, which may be arranged in a ball grid array (BGA), for example, may be disposed on the bottom side of the substrate 102. The substrate 102 may have a uniform composition and may comprise silicon (Si) or any other suitable material.

Each of the various chipsets of different technologies depicted may have characteristics that can be leveraged with corresponding substrate technologies to improve performance of the technologies of each chipset overall. For example, the AMS chipset 104 may see improved performance when paired with a substrate that provides mid-range input/output (I/O) connections. The digital chipset 106 may see improved performance when coupled to a substrate that enables high-range input/output (I/O) connections (e.g., with a fine pitch). The PDN chipset 108 may see improved performance when disposed above a substrate with integrated passive devices (IPDs), such as decoupling capacitors, and/or low resistance for low voltage drop and greater power supply efficiency. The RF chipset 110 may see improved performance when paired with a substrate offering thermal dissipation, electromagnetic shielding, and/or integrated passive devices (e.g., for impedance matching). However, traditional semiconductor fabrication techniques may make it difficult for a single substrate (e.g., the substrate 102) to be formed to accommodate such varied characteristics to leverage the traits of each of the different chipset technologies. In other words, forming a single substrate piece with all the desired characteristics to leverage the various technologies within of the different chipsets may be costly and/or difficult.

Example Hybrid Reconstituted Substrate

Accordingly, certain aspects of the present disclosure provide a hybrid reconstituted substrate, a packaged assembly including such a reconstituted substrate, and methods for fabrication thereof. The reconstituted substrate is generally a conglomeration of multiple individual package-level substrates implemented with different substrate technologies and held together.

Figure 2A:
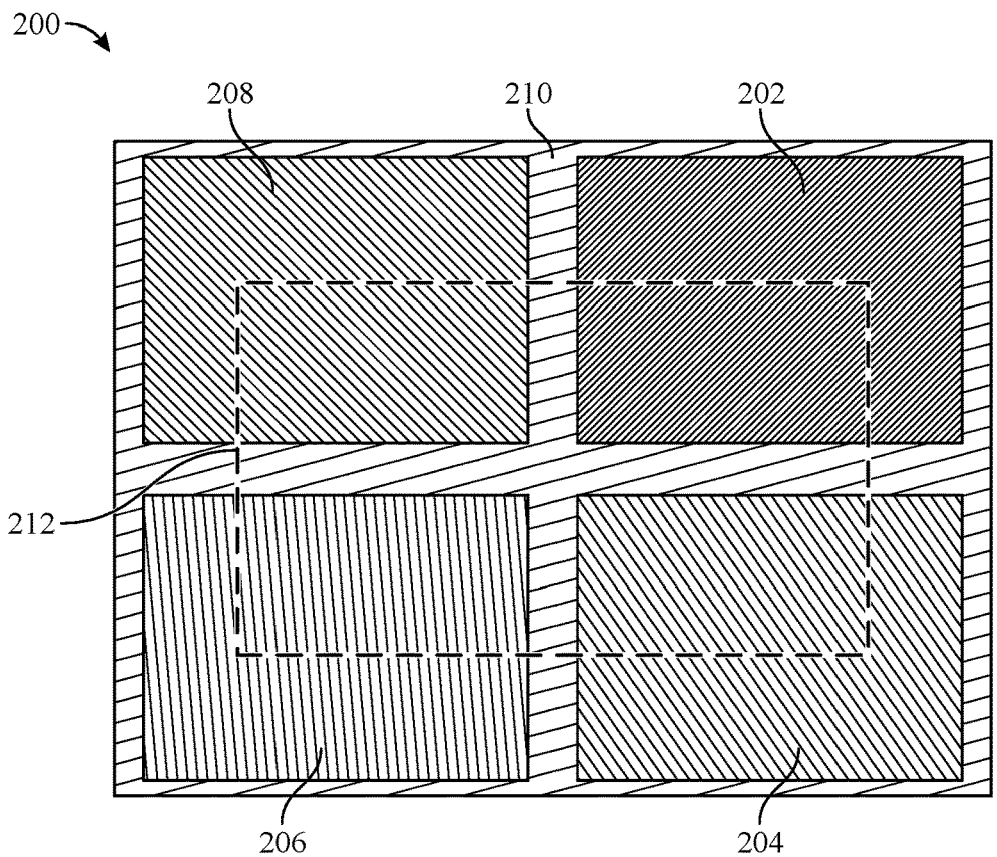
FIGS. 2A and 2B are top views of hybrid reconstituted substrates, in accordance with certain aspects of the present disclosure.

FIG. 2A is a cross-sectional view of a hybrid reconstituted substrate 200, in accordance with certain aspects of the present disclosure. As shown, instead of being a single substrate piece with a uniform composition (like the substrate 102 of FIG. 1A), the reconstituted substrate 200 may include a plurality of different reconstituted portions of different substrates implemented with various substrate technologies, which may be held together by a molding material 210, for example. As illustrated, the reconstituted substrate 200 includes a first substrate 202, a second substrate 204, a third substrate 206, and a fourth substrate 208. Each of the first through fourth substrates 202, 204, 206, 208 may be package-level substrates (i.e., package substrates, as opposed to wafer-level substrates), which may be conductively coupled to different chipsets (e.g., chipsets 103) when fabricating a package assembly, as illustrated by the designated chipset area 212. Although four substrates are illustrated in FIG. 2A, it is to be understood that a reconstituted substrate 200 may include more or less than four substrates. The molding material 210 may be a molding compound, such as a resin, or any other suitable material for holding the multiple substrates together to form a single unit (i.e., the reconstituted substrate).

Figure 2B:
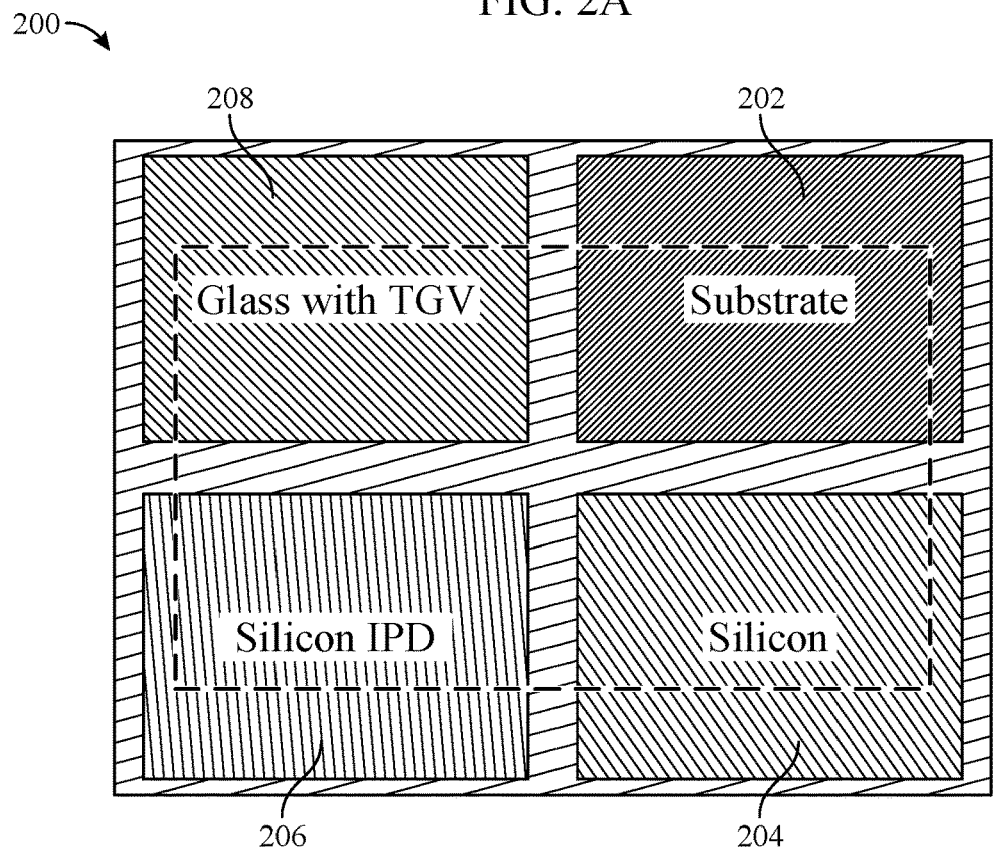

As shown in the example of FIG. 2B, the substrate components of the hybrid reconstituted substrate 200 may be implemented with different substrate technologies. For example, the first substrate 202 may be a laminate substrate, as described further with respect to FIG. 3A. The laminate substrate may be suitable for pairing with the AMS chipset 104, for example. The second substrate 204 may be a silicon (Si) substrate with through-silicon vias (TSVs), as described further with respect to FIG. 3B. The Si substrate with TSVs may be well suited for coupling to a chipset with high density routing, such as the digital chipset 106. Furthermore, the third substrate 206 may be a silicon substrate with integrated passive devices (IPDs), as described further with respect to FIG. 3C. The Si substrate with IPDs may be suitable for pairing with a power delivery chipset, such as the PDN chipset 108. The fourth substrate 208 may include a glass substrate with through-glass vias (TGVs), as described further with respect to FIG. 3D. The glass substrate with TGVs may be suitable for pairing with a chipset specifying low parasitic capacitance, such as the RF chipset 110.

The reconstituted substrate 200 may include a different number of substrates or other types of substrates than those shown in FIG. 2B, to be implemented with corresponding chipset technology, which may or may not be described herein. In certain aspects, multiple substrates having the same substrate type may be included in the reconstituted substrate. Furthermore, although the four substrates in the reconstituted substrate of FIG. 2B have the same size, it is to be understood that two or more of the substrates in the reconstituted substrate may have different sizes.

For certain aspects, the hybrid reconstituted substrate 200 may serve as the package substrate in a packaged assembly, replacing the substrate 102 in the packaged assembly 100, for example. For other aspects, the hybrid reconstituted substrate 200 may function as an interposer in a packaged assembly, rather than as a package substrate. In this case, the hybrid reconstituted substrate 20 may be interposed between the package substrate and the multiple chipsets.

FIGS. 3A-3D are cross-sectional views of a packaged assembly with the hybrid reconstituted substrate 200 of FIG. 2B, in accordance with certain aspects of the present disclosure. Each of the various substrates in FIGS. 3A-3D is a package-level substrate. With respect to each of the cross-sectional views described below, each substrate may be coupled to a corresponding chipset technology by coupling methods described above, such as by flip-chip bumps (e.g., solder bumps 114) or flip-chip copper pillars.

Figure 3A:
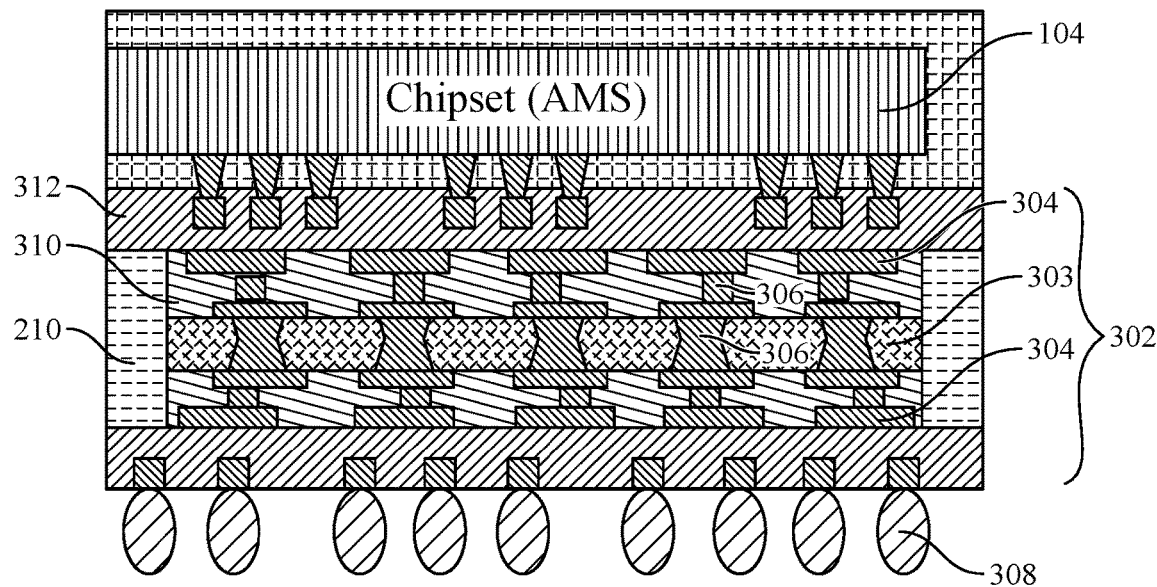
FIGS. 3A-3D are cross-sectional views of different substrate technologies implemented with corresponding chipset technologies for implementing in a packaged assembly with a hybrid reconstituted substrate, in accordance with certain aspects of the present disclosure.

FIG. 3A is a cross-sectional view 300A of a packaged assembly having a laminate substrate 302 corresponding to and coupled to the AMS chipset 104. The laminate substrate 302 may include a core 303 (as shown) made of a suitable reinforcing material (e.g., prepreg), or may be coreless. One more laminate layers 310 may be disposed above and below the core 303. The laminate layers 310 may include a plurality of traces 304 and vias 306 disposed in an electrically insulative material (e.g., copper clad/foil in resin). As shown, some of the vias 306 may extend through the core 303, and some of the traces 304 (or more specifically, the conductive pads) may be coupled to solder balls 308 (e.g., corresponding to the solder balls 116 of FIG. 1B). Some of the traces 304 (or more specifically, the conductive pads) may be coupled to solder bumps 114 of the AMS chipset 104. Furthermore, the laminate substrate 302 may include solder resist layers 312 disposed above and below the laminate layers 310, as shown. The view 300A also illustrates the molding material 210 surrounding lateral surfaces of the laminate substrate 302 in forming the hybrid reconstituted substrate 200.

Figure 3B:
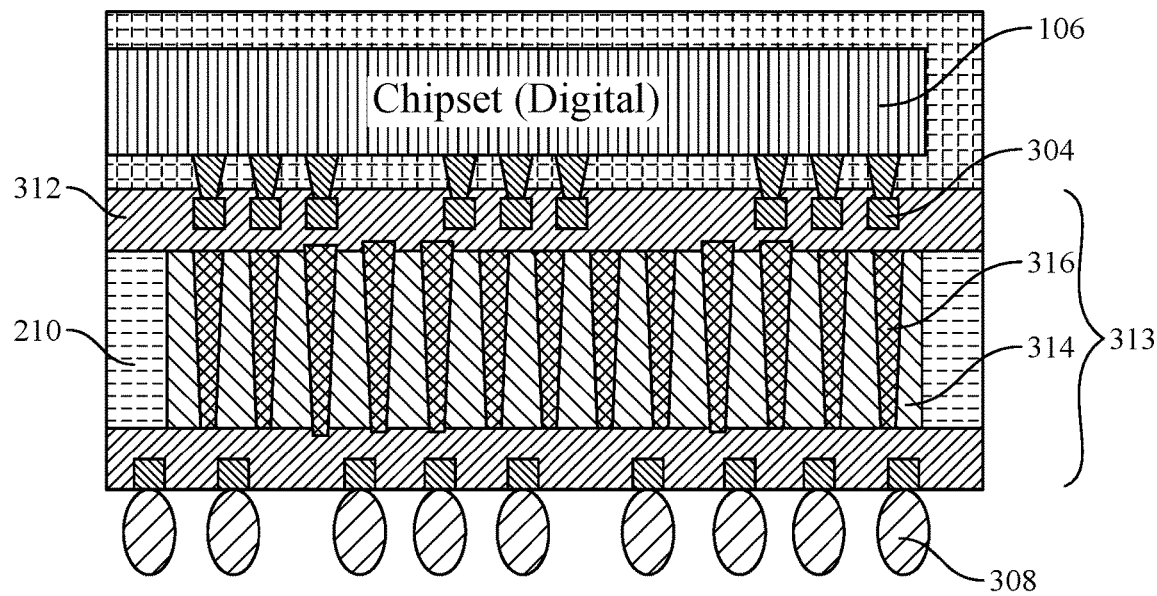

FIG. 3B is a cross-sectional view 300B of a packaged assembly having a silicon substrate 313 (in the reconstituted substrate) corresponding to and coupled to the digital chipset 106. The silicon substrate 313 may include a substrate base 314 composed of a semiconductor material, such as silicon in this case. The substrate base 314 may have through-silicon vias (TSVs) 316 disposed through the base and traces 304 (including conductive pads) disposed above and below the base. The view 300B also illustrates the molding material 210 surrounding lateral surfaces of the silicon substrate 313 in forming the hybrid reconstituted substrate 200.

Figure 3C:
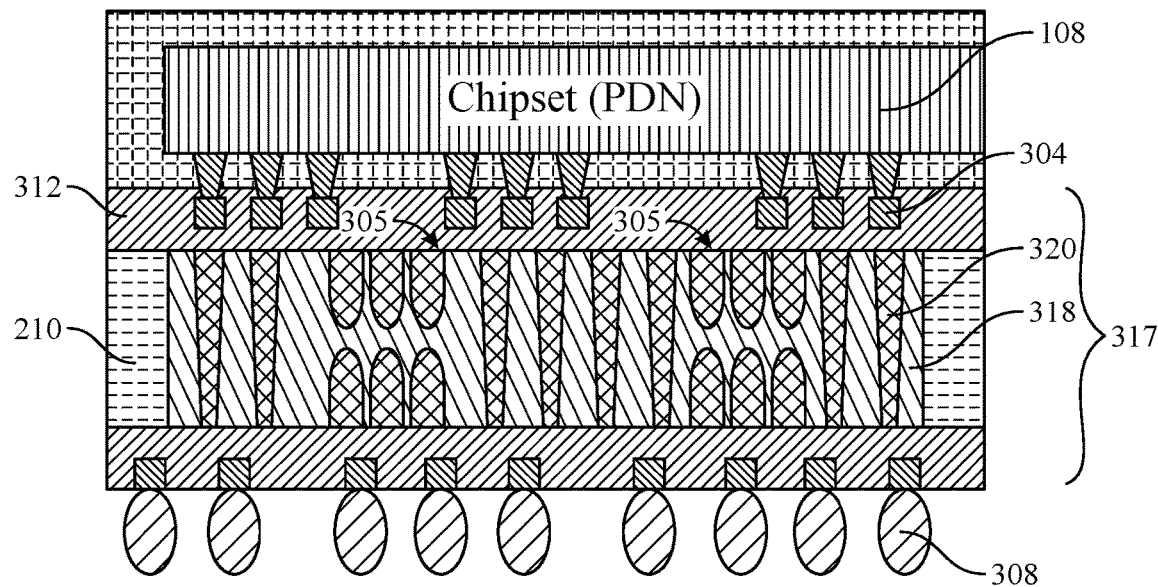

FIG. 3C is a cross-sectional view 300C of a packaged assembly having a silicon substrate 317 corresponding to and coupled to the PDN chipset 108. The silicon substrate 317 may include a substrate base 318 composed of a semiconductor material, such as silicon in this case. The substrate base 318 may have TSVs 320 extending through the base and traces 304 (including conductive pads) disposed above and below the base. The substrate base 318 may also include one or more integrated passive devices (IPDs) disposed within the substrate base. In certain aspects, the one or more integrated passive devices include one or more arrays 305 of trench capacitors, as shown. The silicon substrate 317 with the one or more integrated passive devices may allow for high-density decoupling capacitor(s) to be implemented for coupling to the PDN chipset 108, as shown. The view 300C also illustrates the molding material 210 surrounding lateral surfaces of the silicon substrate 317 in forming the hybrid reconstituted substrate 200.

Figure 3D:
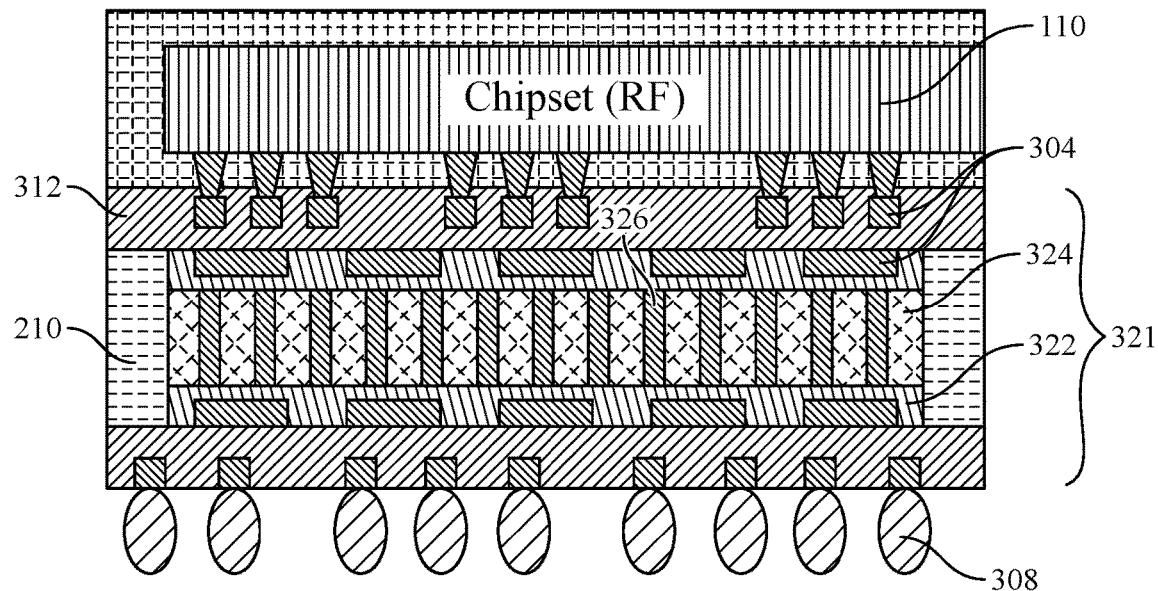

FIG. 3D is a cross-sectional view 300D of a packaged assembly having a glass substrate 321 corresponding to and coupled to the RF chipset 110. The glass substrate 321 may provide low-loss interconnections between components of the RF chipset 110. The glass substrate 321 may include a substrate base 324 composed of glass, through-glass vias (TGVs) 326 extending through the substrate base 324, and a plurality of traces 304 (including conductive pads) disposed above and below the base. For certain aspects, the glass substrate 321 may also include one or more additional layers 322 (e.g., laminate layers) disposed above and below the substrate base 324. The additional layers 322 may include traces 304 disposed in an insulative material, such as resin. The view 300D also illustrates the molding material 210 surrounding lateral surfaces of the glass substrate 321 in forming the hybrid reconstituted substrate 200.

Integrating chipsets with different applications onto a hybrid reconstituted substrate combining different substrate technologies, as described herein, may be advantageous. By using a hybrid reconstituted substrate, each of the various circuits (e.g., semiconductor dies) disposed on the reconstituted substrate may see improved performance when each portion of the reconstituted substrate is formed to correspond with specific characteristics of each technology for that circuit (die), compared to performance when these circuits are disposed on a single, uniform substrate. Each of the portions of a hybrid reconstituted substrate may be smaller pieces of previously fabricated substrates, which may have been formed differently or utilize different substrate technology. In this sense, a hybrid reconstituted substrate implements multiple different substrate technology types onto a single piece in a cost-reducing manner by attaching the smaller pieces together with a molding material.

Example Fabrication Operations

Figure 4:
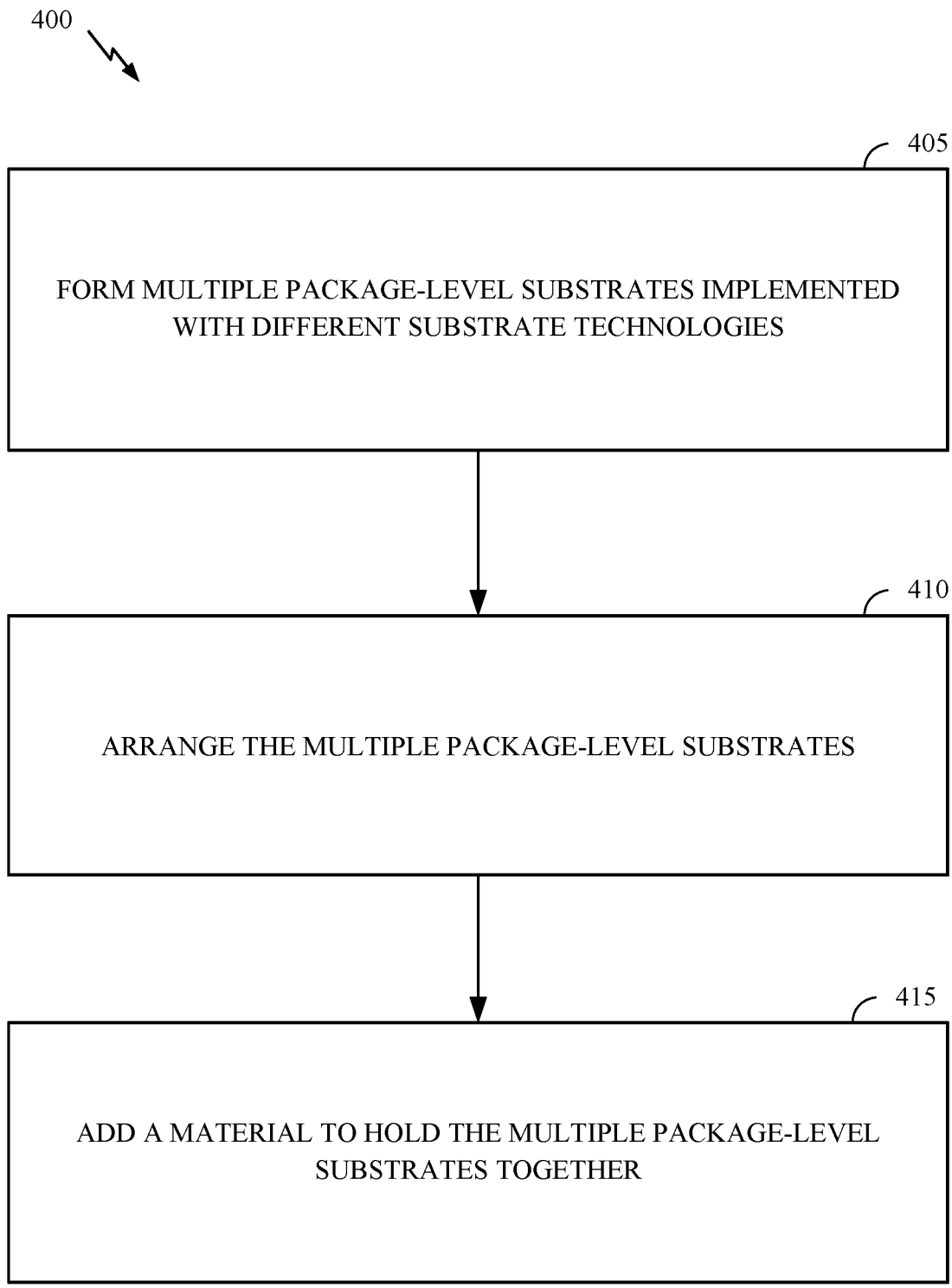
FIG. 4 is a flow diagram of example operations for fabricating a hybrid reconstituted substrate, in accordance with certain aspects of the present disclosure.

FIG. 4 is a flow diagram of example operations 400 for fabricating a reconstituted substrate (e.g., the reconstituted substrate 200 depicted in FIG. 2B), in accordance with certain aspects of the present disclosure. The operations 400 may be performed by a fabrication facility, for example.

The operations 400 may begin, at block 405, with the fabrication facility forming multiple package-level substrates (e.g., the substrates 202, 204, 206, 208) implemented with different substrate technologies. At block 410, the facility arranges the multiple package-level substrates. At block 415, the facility adds a material (e.g., the molding material 210) to hold the multiple package-level substrates together.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A reconstituted substrate comprising multiple package-level substrates implemented with different substrate technologies and held together, wherein the multiple package-level substrates comprise:
   a first package-level substrate implemented with a first substrate technology, wherein the first substrate technology comprises a first silicon substrate with through-silicon vias;
   a second package-level substrate implemented with a second substrate technology, wherein the second substrate technology comprises a second silicon substrate with integrated passive devices;
   a third package-level substrate implemented with a third substrate technology, wherein the third substrate technology comprises a substrate base consisting of glass with through-glass vias; and
   a fourth package-level substrate implemented with a fourth substrate technology, the fourth substrate technology being different from the first substrate technology, the second substrate technology, and the third substrate technology, wherein the first package-level substrate, the second package-level substrate, the third package-level substrate, and the fourth package-level substrate are coplanar in the reconstituted substrate.

2. The reconstituted substrate of claim 1, wherein the second package-level substrate is disposed adjacent to the first package-level substrate.

3. The reconstituted substrate of claim 2, wherein the third package-level substrate is disposed adjacent to at least one of the first package-level substrate or the second package-level substrate.

4. The reconstituted substrate of claim 3, wherein the fourth package-level substrate is disposed adjacent to at least one of the first package-level substrate, the second package-level substrate, or the third package-level substrate.

5. The reconstituted substrate of claim 4, wherein the fourth substrate technology comprises a laminate substrate.

6. The reconstituted substrate of claim 4, wherein the integrated passive devices comprise arrays of trench capacitors.

7. The reconstituted substrate of claim 1, further comprising a molding compound holding the multiple package-level substrates together.

8. The reconstituted substrate of claim 7, wherein the molding compound comprises a resin.

9. A packaged assembly comprising:
   a reconstituted substrate comprising multiple package-level substrates implemented with different substrate technologies and held together; and
   multiple chipsets for different applications coupled to the multiple package-level substrates of the reconstituted substrate, wherein the multiple package-level substrates comprise:
      a first package-level substrate implemented with a first substrate technology, wherein the first substrate technology comprises a first silicon substrate with through-silicon vias;
      a second package-level substrate implemented with a second substrate technology, wherein the second substrate technology comprises a second silicon substrate with integrated passive devices;
      a third package-level substrate implemented with a third substrate technology, wherein the third substrate technology comprises a substrate base consisting of glass with through-glass vias; and
      a fourth package-level substrate implemented with a fourth substrate technology, the fourth substrate technology being different from the first substrate technology, the second substrate technology, and the third substrate technology, wherein the first package-level substrate, the second package-level substrate, and the third package-level substrate are coplanar.

10. The packaged assembly of claim 9, wherein the second package-level substrate is disposed adjacent to the first package-level substrate.

11. The packaged assembly of claim 10, wherein the multiple chipsets comprise:
   a first chipset for a first application and coupled to the first package-level substrate; and
   a second chipset for a second application and coupled to the second package-level substrate, the second application being different from the first application.

12. The packaged assembly of claim 11, wherein the first chipset comprises a digital chipset coupled to the first silicon substrate with the through-silicon vias.

13. The packaged assembly of claim 12, wherein the second chipset comprises a power distribution network chipset coupled to the second silicon substrate with the integrated passive devices.

14. The packaged assembly of claim 12, wherein the second chipset comprises an analog or mixed signal chipset coupled to the second silicon substrate.

15. The packaged assembly of claim 12, wherein the second chipset comprises a radio frequency chipset coupled to the substrate base with the through-glass vias.

16. The packaged assembly of claim 9, further comprising a package substrate, wherein the reconstituted substrate comprises an interposer and wherein the interposer is interposed between the package substrate and the multiple chipsets.

* * * * *